United States Patent
Hofmann et al.

(10) Patent No.: US 11,159,183 B2
(45) Date of Patent: Oct. 26, 2021

(54) RESIDUE CHECKING OF ENTIRE NORMALIZER OUTPUT OF AN EXTENDED RESULT

(71) Applicant: International Business Machines Corporation, Armonk, NY (US)

(72) Inventors: Nicol Hofmann, Boeblingen (DE); Michael Klein, Boeblingen (DE); Kerstin Claudia Schelm, Boeblingen (DE); Razvan Peter Figuli, Boeblingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 117 days.

(21) Appl. No.: 16/453,395

(22) Filed: Jun. 26, 2019

(65) Prior Publication Data

US 2020/0412388 A1    Dec. 31, 2020

(51) Int. Cl.
*H03M 13/00* (2006.01)
*H03M 13/03* (2006.01)
(Continued)

(52) U.S. Cl.
CPC ........ *H03M 13/6586* (2013.01); *G06F 7/724* (2013.01); *H03M 13/033* (2013.01); *H03M 13/07* (2013.01); *H03M 13/096* (2013.01); *G06F 5/012* (2013.01); *G06F 7/483* (2013.01); *G06F 7/49936* (2013.01); *G06F 7/72* (2013.01); *G06F 11/104* (2013.01); *G06F 11/2226* (2013.01); *G06F 2207/3824* (2013.01)

(58) Field of Classification Search
CPC .......... G06F 7/483; G06F 7/72; G06F 11/104; G06F 11/2226; G06F 2207/3824; G06F 7/49936; G06F 7/724; G06F 5/012; H03M 13/07; H03M 13/6586; H03M 13/033; H03M 13/096
See application file for complete search history.

(56) References Cited

U.S. PATENT DOCUMENTS

2010/0100578 A1    4/2010  Dao et al.
2010/0146027 A1*   6/2010  Dao ........................ G06F 11/08
                                                    708/491

(Continued)

OTHER PUBLICATIONS

Transmittal Form PTO/SB/21, filed Mar. 19, 2020.

*Primary Examiner* — April Y Blair
*Assistant Examiner* — Sazzad Hossain
(74) *Attorney, Agent, or Firm* — Cantor Colburn LLP; Steven Chiu

(57) ABSTRACT

A method includes generating an extended result from a first operation circuitry having a result register bit width greater than a bus width associated with a residue check path of a second operation circuitry associated with a floating point unit. An extended result residue less a first portion residue of the extended result received from the residue check path is stored as a first partial result residue. The first partial result residue is compared with a first result residue of the second operation circuitry. The extended result residue less both the first partial result residue and a second portion residue of the extended result received from the residue check path as a second partial result residue is compared with a second result residue of the second operation circuitry.

9 Claims, 4 Drawing Sheets

(51) Int. Cl.
*G06F 7/72* (2006.01)
*H03M 13/09* (2006.01)
*H03M 13/07* (2006.01)
G06F 5/01 (2006.01)
G06F 7/499 (2006.01)
G06F 11/22 (2006.01)
G06F 7/483 (2006.01)
G06F 11/10 (2006.01)

(56) References Cited

U.S. PATENT DOCUMENTS

| | | |
|---|---|---|
| 2013/0339417 A1* | 12/2013 | Haess .................... G06F 7/72 708/512 |
| 2014/0164462 A1 | 6/2014 | Boersma et al. |
| 2014/0188965 A1 | 7/2014 | Iacobovici |

* cited by examiner

RESIDUE CHECKING OF ENTIRE NORMALIZER OUTPUT OF AN EXTENDED RESULT

BACKGROUND

The present invention relates generally to residue-based error detection, and more specifically, to residue checking of the entire normalizer output of an extended result.

SUMMARY

Embodiments of the present invention include methods, systems, and computer program products for residue-based error detection. A non-limiting example method includes generating an extended result from a first operation circuitry having a result register bit width greater than a bus width associated with a residue check path of a second operation circuitry associated with a floating point unit. An extended result residue less a first portion residue of the extended result received from the residue check path is stored as a first partial result residue. The first partial result residue is compared with a first result residue of the second operation circuitry. The extended result residue less both the first partial result residue and a second portion residue of the extended result received from the residue check path as a second partial result residue is compared with a second result residue of the second operation circuitry. The floating point unit is operated according to the comparison of the first partial result residue with the first result residue and the comparison of the second partial result residue with the second result residue.

A non-limiting example system includes a floating point unit including first operation circuitry having a result register bit width sized to store an extended result and second operation circuitry having a bus width associated with a residue check path being less than the result register bit width. The system includes residue check circuitry associated with the floating point unit that includes a residue check latch operable to receive an extended result residue associated with the extended result less a first portion residue of the extended result received from the residue check path as a first partial result residue.

Another non-limiting example system includes a floating point unit that includes first operation circuitry having a result register bit width operable to store an extended result and second operation circuitry having a bus width associated with a residue check path having only one multiplexer being less than the result register bit width. The system includes residue check circuitry associated with the floating point unit that includes a residue check latch operable to receive an extended result residue associated with the extended result less a first portion residue of the extended result received from the residue check path as a first partial result residue.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

Figure 1:
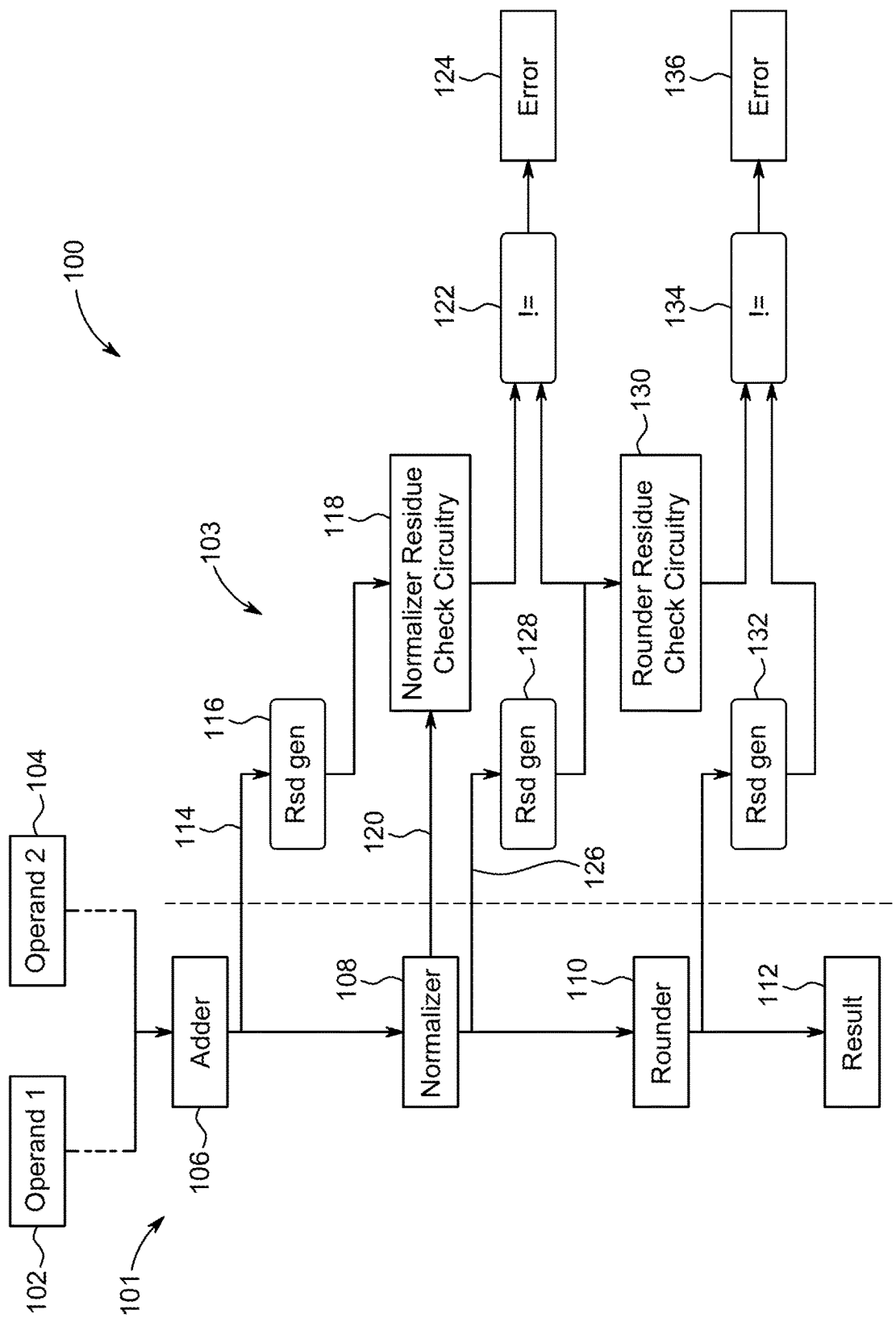
FIG. 1 illustrates a block diagram of portions of a floating point unit having circuitry according to one or more embodiments of the present invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describe having a communications path between two elements and do not imply a direct connection between the elements with no intervening elements/connections between them. All of these variations are considered a part of the specification.

DETAILED DESCRIPTION

Embodiments described herein provide a method for error checking a floating point unit using a hardware implementation for a residue check of the whole extended output of a normalizer, with only a small amount of additional residue logic. It should be appreciated that any arithmetic unit, floating point or otherwise, may implement teachings described herein or portions thereof. As used herein, the term "circuitry" refers to any combination of logic, wires, fundamental components, transistors, diodes, latches, switches, flip-flops, or other implements, that may be arranged to carry the intended output.

A critical path may define a group of functional operations and clock cycle requirements to obtain a desired result. Each functional operation in the critical path may increase the processing time for an operation or process to complete. Precision for floating point units relates to the amount of detail encapsulated in the binary number. For example, precision thresholds may include single precision (32 bits), double precision (64 bits), quadruple precision (128 bits), or any other number of associated bits. Normalization of floating point numbers arranges the fractional portion of the number to remove the leading zeros of the floating point format and adjusts the exponent accordingly. Floating point numbers with increased precision or precision greater than the normalizer bus bit width may require additional normalization cycles to properly normalize the extended precision number. For example, a double precision number may be normalized on a single precision normalizer. As such, additional clock cycles may be required for a residue check to be completed. A quadruple precision number may be normalized on a single or double precision normalizer. The floating point number may be a binary floating point number or a hexadecimal floating point number.

A residue check may be performed in parallel with floating point unit operations at different functional elements (e.g., adder, multiplier, normalizer, and rounder). Residue checking may require additional clock cycles based on the precision of the number and the precision of the functional element. For example, an extended precision number may require additional clock cycles or additional multiplexers to properly generate a residue and perform the residue check, increasing the critical path and die size of the execution unit. A latch may be used to retain portions of a previous cycle to reduce the number of multiplexers or clock cycles required to perform the residue check for extended precision operations. Extended precision operations may be performed on functional elements having less precision than the previous functional element without requiring additional multiplexers or clock cycles.

As an example, a normalizer may receive a 175 bit fraction portion of an adder result. The normalizer may be configured to shift the fraction portion based on a shift amount to remove leading zeros. If the normalizer output only has a 57 bit bus, the fraction is normalized in two cycles. The loss—or unused portions of the received adder result during the given cycle—may be residue checked while requiring additional multiplexors on the residue check path to select the loss on the left or the loss on the right.

An equivalent to the loss on the left may be computed without the need for additional multiplexors on the residue check path, reducing the circuitry chip footprint or clock cycles required. Additionally, only one residue generator may be required along the residue check path instead of additional residue generators. The loss may be computed by retaining portions of the first partial result residue and generating the second partial result residue for similar comparisons.

Referring to FIG. 1, a floating point unit 100 is generally shown according to one or more embodiments of the present invention. The floating point unit 100 includes functional circuitry 101 and parallel residue check circuitry 103. The functional circuitry 101 generates the desired result from operands 102, 104. The residue check circuitry 103 validates the results. As shown in FIG. 1, the floating point unit 100 operates on at least two operands 102, 104 as subjects of the mathematical operations performed therein. The floating point unit 100 may include additional functional elements than those shown (e.g., adder 106, normalizer 108, rounder 110, and final result register 112). A combination of the bit width of the first operand 102 and the bit width of the second operand 104 may be equal to the bit width of the extended output from first operation circuitry 106. As such, the extended result bit width, 128 bits for example, may be a combination of the first input operand 102 having a first operand bit width of 64 bits, for example, and the second input operand 104 having a second operand bit width of 64 bits, as an example. The first operand 102 and the second operand 104 may have the same bit width.

Addition of the first operand 102 and the second operand 104, or subsequent values thereof, are added in first operation circuitry. As shown, the first operation circuitry is an adder 106 and the second operation circuitry is a normalizer 108. This is just one example of the first operation circuitry and the second operation circuitry. The first operation circuitry or second operation circuitry may be any circuitry that is operable to provide an extended result. As just one example, the first operation circuitry could be a multiplier or other arithmetic process. As shown, first operation circuitry provides input to second operation circuitry. The second operation circuitry could be any type of floating point normalizer or another functional element (e.g., rounder). The normalizer output 126 is provided to the rounder 110 and rounder 110 provides floating point output result 112.

Residue check circuitry 103 receives output from adder 106 as input to the extended result residue generator 116 via bus 114. The residue from generator 116 is sent to normalizer residue check circuitry 118. Normalizer 108 has a residue check path 120 that includes data from normalizer 108. Normalizer output residue generator 128 provides a residue of the normalizer output 126. The normalizer output residue from normalizer output residue generator 128 is compared with the output of the normalizer residue check circuitry 118. If the residue from normalizer output residue generator 128 and normalizer residue check circuitry 118 are not equal, as determined in block 122, an error 124 is communicated.

As shown in the embodiment in FIG. 1, the rounder 110 is associated with rounder residue check circuitry 130. That is, output from rounder 110 is sent to a rounder residue generator 132 and compared with the output from the rounder residue check circuitry 130 in block 134. If the rounder residue generator 132 output is not the same as the output from the rounder residue check circuitry 130, a rounder residue error 136 is outputted.

Figure 2:
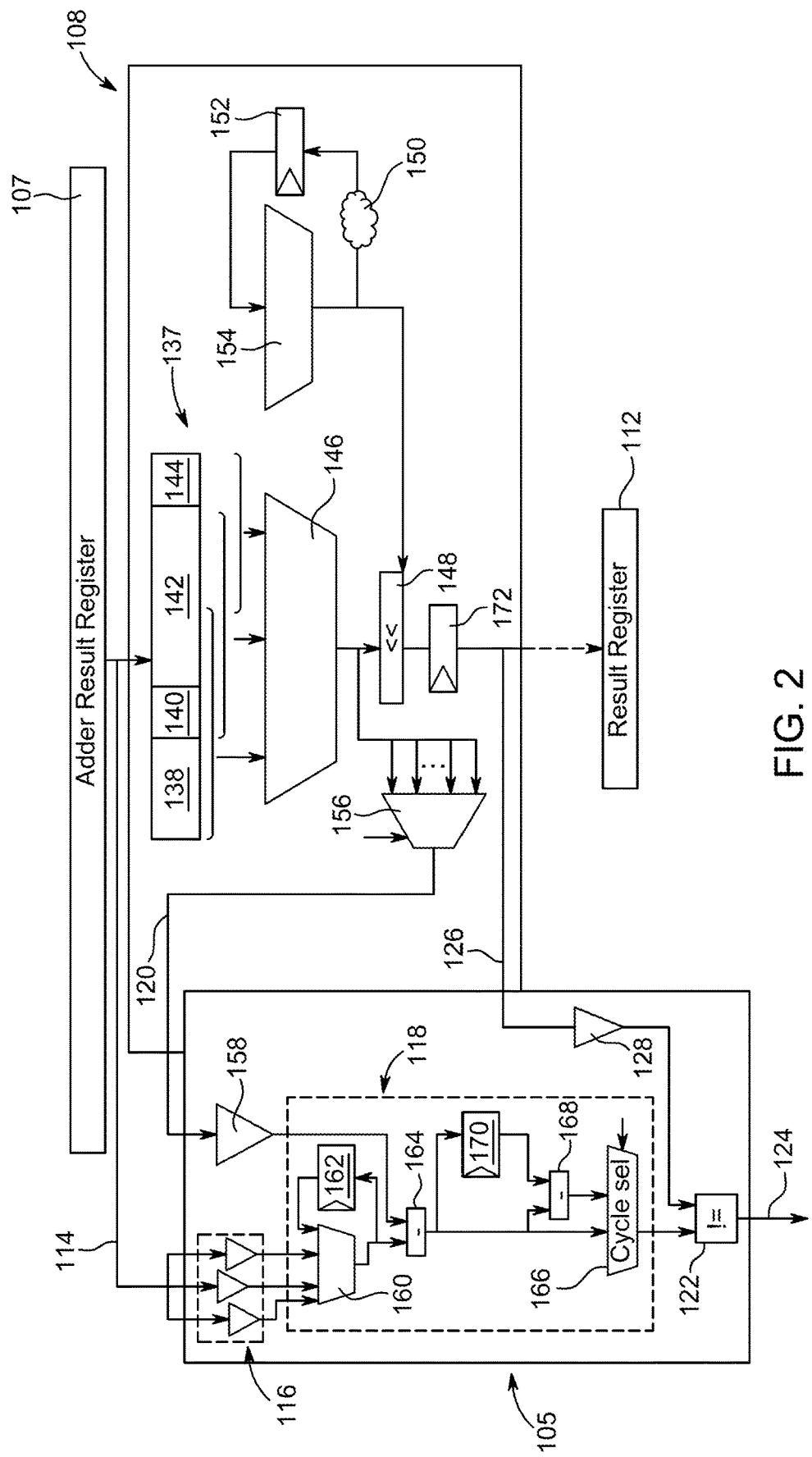
FIG. 2 illustrates a block diagram of a normalizer and a residue check circuitry according to one or more embodiments of the present invention.

Referring to FIG. 2, a block diagram of normalizer 108 of FIG. 1 and portions 105 of residue check circuitry 103 of FIG. 1 are generally shown in accordance with one or more embodiments of the present invention. An extended result register 107 from adder 106 provides input to normalizer 108. That is, extended result register 107 is a result of the addition of operand one 102 and operand two 104. The adder 106 computes an additive result of the operands 102, 104 and stores the result in the extended result register 107. The normalizer 108 receives the extended result from the extended result register 107 through a connective data bus, as shown. A bit width of the extended result register 107 may be 175 bits. That is, adder result register 107 may include 175 memory locations or flip-flops for storing the adder result register 107. Normalizer input 137 includes control portions 138, 140, 144 and fraction result portion 142. The fraction result portion 142 may be twice the bit width than the input operand bit width. The fraction result portion 142 may be 112 bits, as is generally associated with a quadruple precision floating point number. Input multiplexer 146 selects the necessary bits to be normalized by normalizer shift register 148. Such bits may be selected by residue check path multiplexer 156 and sent along residue check path 120. Normalizer shift register 148 may output to a normalizer shift register latch 172. Normalizer shift register 148 is controlled by control input 150, control latch 152, and control multiplexer 154. As such, the normalizer shift register 148 shifts the fractional portion the requisite number of bits such that the leading zeros of the fraction result portion 142 are shifted out.

A residue check path 120 may have a bit width that is less than the bit width of the adder result register 107. The residue check path 120 may draw multiplexed binary information before the shift register 148 has adjusted the fraction result portion 142. The extended result register 107 or portion thereof may be greater than the bus width of the residue check path 120 associated with the normalizer 108. As an example, the residue check path 120 may have a bit width of 64. An extended result residue generator 116 or residue tree may compute an extended result residue and through extended result residue multiplexer 160. The output of extended result residue multiplexer 160 may be stored in extended result residue multiplexer latch 162. A residue check path residue generator 158 may compute a portion residue based on the fraction result portion 142, according to bits received along residue check path 120. As such, the extended result residue from extended result residue multiplexer 160 less a portion residue from residue check path residue cinerator 158 is determined based on first subtraction block 164, according to subtraction block 168, a portion residue may be stored in residue check latch 170 as a loss. That is, a second subtraction block 168 may perform a bitwise subtraction of the extended result and a first or second portion residue from residue check path residue generator 158 and store such a result as the extended result less a portion residue in residue check latch 170. For example, the loss may be a representative residue of the loss on the left or the loss on the right. That is, the residue check latch 170 can receive and store residue. As such, the residue check latch 170 may include portions of the loss on the left or portions of the loss on the right.

The use of the residue check latch may be determined based on the cycle selection multiplexer 166. The residue check latch 170 may be subtracted from other residues to coordinate proper residue checking of the output 126 from normalizer 108 and associated normalizer output residue generator 128. As such, both cycles of normalizer output 126 may be compared with respective losses by selection through the cycle selection multiplexer 166 and the residue check latch 170.

Figure 3:
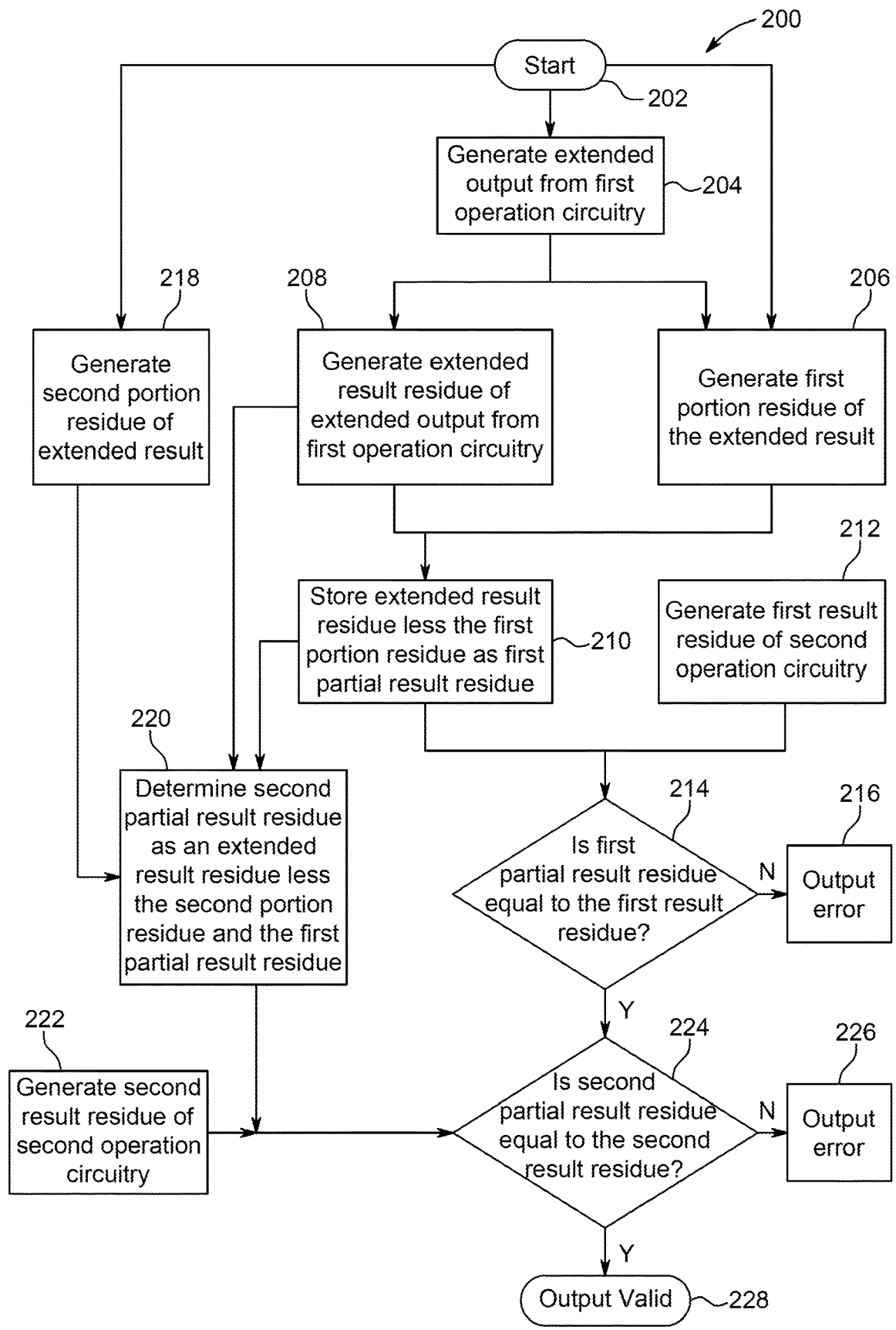
FIG. 3 illustrates a flow diagram of a residue check according to one or more embodiments of the present invention.

Referring to FIG. 3, a method 200 for performing a residue check on an extended result is generally shown in accordance with one or more embodiments of the present invention. The method begins in block 202. In block 204, an extended output is generated from a first operation circuitry 106. The extended output may be considered extended with respect to a bus width of a second operation circuitry 108 or a bus width of a residue check path 120. In block 206, a first portion residue of the extended result 107 is generated. The first portion residue from residue check path 120 of the extended result may be representative of or based on a loss on the right of the normalizer. That is, the first portion residue is the residue through residue check path residue generator 158 on a first clock cycle of the floating point unit 100.

In block 208, an extended result residue of the extended output from the first operation circuitry 106 is calculated from extended result residue generator 116. As is known, a residue reduction tree may be configured with any modulo to provide respective outputs. For example, the residue reduction tree may be mod 15. Several residue reduction trees may be stacked to calculate the require residue. As such, the extended result residue from extended result residue generator 116 less the first portion residue from residue check path residue generator 158 is stored as the first partial result residue in residue check latch 170 in block 210. It should be appreciated that the residue check latch 170 may be any type of register or latch configuration configured to store binary data.

In block 212, a first result residue from normalizer output residue generator 128 of the second operation circuitry 108 is generated. In block 214, the first partial result residue stored in residue check latch 170 is compared with the first result residue from normalizer output residue generator 128. The comparison in block 214 may be a bitwise comparison. If the first partial result residue stored in residue check latch 170 is not equal to the first result residue from the normalizer output residue generator 128, the floating point unit or residue check circuitry will output an error in block 216. The preceding blocks may be performed on one clock cycle or predetermined number of clock cycles. It should be appreciated that results may be stored in non-transitory memory, latches, registers, or other non-transitory storage locations.

In block 218, the method continues. Block 218 may be performed according to a second clock cycle or subsequent cycles. In block 218 a second portion residue from residue check path 120 of the extended result 107 is generated. A second partial result residue is determined in block 220. The second partial result residue is the extended result residue computed in 208 less the first partial result residue stored in residue check latch 170 and the second portion residue from residue check path 120. In block 222 a second result residue of the second operation circuitry is generated. In block 224, the second partial result residue is compared with the second result residue. The comparison in block 224 may be a bitwise comparison. If the second partial result residue is equal to the second result residue, the residue check outputs an error in block 226. Otherwise, the residue check circuitry outputs that the normalizer output is valid in block 228.

Figure 4:
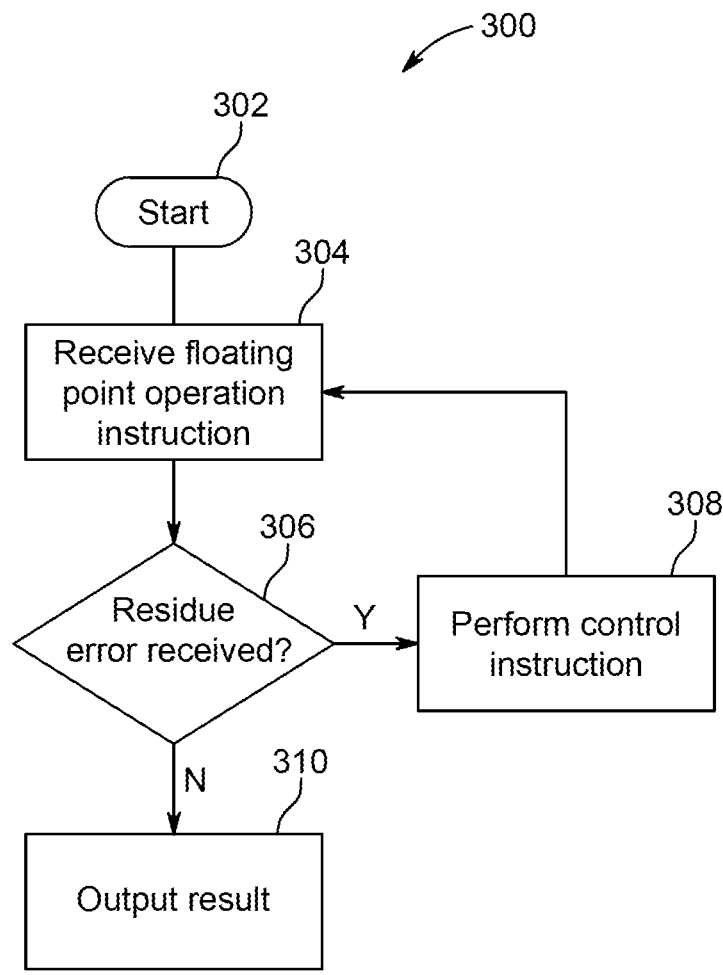
FIG. 4 illustrates a flow diagram of floating point unit operation according to one or more embodiments of the present invention.

Referring to FIG. 4, a method 300 for operating a floating point unit and associated circuitry is generally shown in accordance with one or more embodiments of the present invention. The method 300 may be implemented by floating point monitoring circuitry or by a processing unit interrupt. In block 302, the method begins. In block 304, floating point operation instructions are received. The floating point instructions may be any arithmetic instruction including addition and multiplication. The instructions may also include floating point control instructions including checking for error conditions, storing, saving, or restoring conditions. In block 306, the floating point unit or supervisory processing unit determines whether a residue error was received. In response to the residue error being received the floating point unit may perform a received or determined control instruction in block 308. For example, the floating point unit may be stopped or the floating point unit may stop operations on one of the first operation circuitry 106 or second operation circuitry 108. Additionally, the floating point unit may restart the first operation circuitry 106 or the second cooperation circuitry in response to receiving an error. In block 310, if no error is detected, the result from the floating point unit is outputted.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

In an exemplary embodiment, the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The instructions disclosed herein, which may execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   receiving, at a normalizer, an extended result from first operation circuitry of a floating point unit, wherein the extended result comprises a first set of bits comprising leading zeros of the extended result, a second set of bits, a third set of bits, and a fourth set of bits comprising remaining bits to the right of the third set of bits;
   determining a residue of the extended result;
   determining a first normalizer result during a first normalizer cycle, the first normalizer result comprising the second set of bits;
   determining a first portion residue of the extended result, the first portion residue comprising a loss to the right of the normalizer during the first normalizer cycle, wherein the loss to the right of the normalizer during the first normalizer cycle comprises the third set of bits and the fourth set of bits;
   storing the residue of the extended result less the first portion residue of the extended result as a first partial result residue;
   determine a first result residue of the second set of bits;
   comparing the first partial result residue with the first result residue;
   determining a second normalizer result during a second normalizer cycle, the second normalizer result comprising the third set of bits;
   determining a second portion residue of the extended result, the second portion residue comprising a loss to the right of the normalizer during the second normalizer cycle, wherein the loss to the right of the normalizer during the second normalizer cycle comprises the fourth set of bits;
   storing the residue of the extended result less the second portion residue and the first partial result residue as a second partial result residue;
   determine a second result residue of the third set of bits;
   comparing the second partial result residue with the second result residue; and
   operating the floating point unit according to the comparison of the first partial result residue with the first result residue and the comparison of the second partial result residue with the second result residue.

2. The method of claim 1, wherein the first operation circuitry is an adder or a multiplier.

3. The method of claim 1, wherein the operation of the floating point unit includes outputting an error responsive to one or both of the comparison of the first partial result residue with the first result residue and the comparison of the second partial result residue with the second result residue such that operation of the floating point unit is stopped.

4. The method of claim 3, wherein the operation of the floating point unit includes outputting the error such that operation of the floating point unit is restarted.

5. The method of claim 1, wherein the extended result includes an extended result bit width that is equal to a first input operand bit width and a second input operand bit width combined.

6. A system comprising:
a floating point unit including first operation circuitry operable to store an extended result and a normalizer operable to receive the extended result, wherein the extended result comprises a first set of bits comprising leading zeros of the extended result, a second set of bits, a third set of bits, and a fourth set of bits comprising remaining bits to the right of the third set of bits; and
residue check circuitry associated with the floating point unit that includes a residue check latch;
wherein the floating point unit is configured to:
determine a residue of the extended result;
determine a first normalizer result during a first normalizer cycle, the first normalizer result comprising the second set of bits;
determine a first portion residue of the extended result, the first portion residue comprising a loss to the right of the normalizer during the first normalizer cycle, wherein the loss to the right of the normalizer during the first normalizer cycle comprises the third set of bits and the fourth set of bits;
store the residue of the extended result less the first portion residue of the extended result as a first partial result residue;
determine a first result residue of the second set of bits;
compare the first partial result residue with the first result residue;
determine a second normalizer result during a second normalizer cycle, the second normalizer result comprising the third set of bits;
determine a second portion residue of the extended result, the second portion residue comprising a loss to the right of the normalizer during the second normalizer cycle, wherein the loss to the right of the normalizer during the second normalizer cycle comprises the fourth set of bits;
store the residue of the extended result less the second portion residue and the first partial result residue as a second partial result residue;
determine a second result residue of the third set of bits; and
compare the second partial result residue with the second result residue.

7. The system of claim 6, wherein the residue check circuitry is operable to:
compare an extended result residue associated with the extended result less a first portion residue of the extended result with the first result residue; and
compare the extended result residue less the first partial result residue as a second partial result residue with a second result residue of the normalizer.

8. The system of claim 7, wherein the floating point unit is operable to stop operation of the first operation circuitry and the normalizer based on results of the comparisons of:
the first partial result residue with the first result residue of the normalizer; and
the second partial result residue with the second result residue of the normalizer.

9. The system of claim 6, wherein the extended result is equal to or less than a first input operand bit width and a second input operand bit width combined.

* * * * *